United States Patent [19]

Tarakci

[11] 4,042,387
[45] Aug. 16, 1977

[54] PHOTOLITHOGRAPHIC METHOD OF MAKING MICROCIRCUITS USING GLYCERINE IN PHOTORESIST STRIPPING SOLUTION

[75] Inventor: Umit Tarakci, Oxnard, Calif.

[73] Assignee: Rockwell International Corporation, El Segundo, Calif.

[21] Appl. No.: 683,553

[22] Filed: May 5, 1976

[51] Int. Cl.$^2$ .................................................. G03C 5/00
[52] U.S. Cl. .......................................... 96/36; 96/36.2; 427/96; 427/98; 156/659
[58] Field of Search ...................... 96/36, 36.2; 204/15, 204/38 E; 134/1, 2, 3; 252/59, 79.1; 156/2, 3, 8, 659; 427/96, 98, 99

[56]  References Cited
 U.S. PATENT DOCUMENTS

| | | | |
|---|---|---|---|
| 2,127,469 | 8/1938 | Hempel | 134/3 |
| 3,443,915 | 5/1969 | Wood et al. | 96/36.2 UX |
| 3,520,683 | 7/1970 | Kerwin | 96/36.2 |
| 3,676,219 | 7/1972 | Schroeder et al. | 134/3 |
| 3,787,239 | 1/1974 | Schroeder et al. | 134/2 |
| 3,813,309 | 5/1974 | Bakos et al. | 156/2 |
| 3,871,929 | 3/1975 | Schevey et al. | 156/8 X |
| 3,900,337 | 8/1975 | Beck et al. | 134/3 |
| 3,945,826 | 3/1976 | Friedman et al. | 96/36 |

Primary Examiner—Edward C. Kimlin
Attorney, Agent, or Firm—L. Lee Humphries; Craig O. Malin

[57]  ABSTRACT

Following the generation of a pattern in a photoresist layer on a non-metallic wafer and development and rinsing thereof, the wafer is slightly etched and immediately metallized. The developed photoresist portions are softened in a stripper solved in methanol, and the unwanted metallization portions are lifted by boiling the wafer in an acetone-lubricant bath. The same liquid is used for a mild scrubbing followed by spraying the wafer in pure acetone.

25 Claims, 5 Drawing Figures

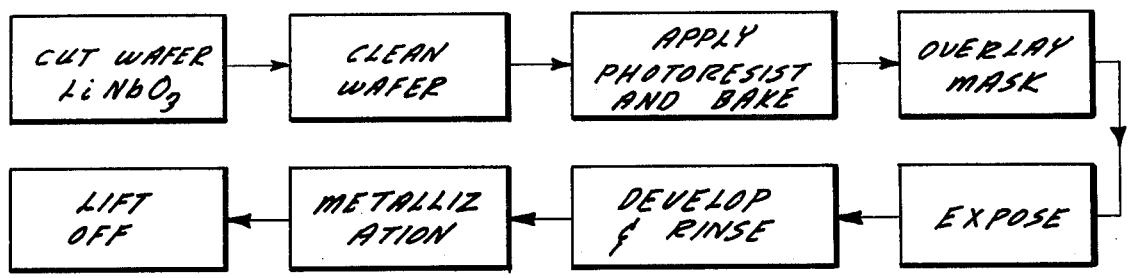
FIG. 1 PRIOR ART
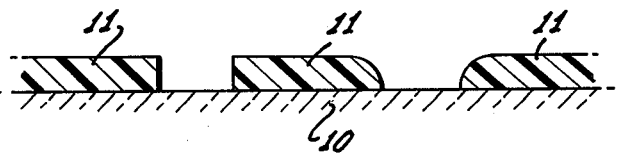
FIG. 2a
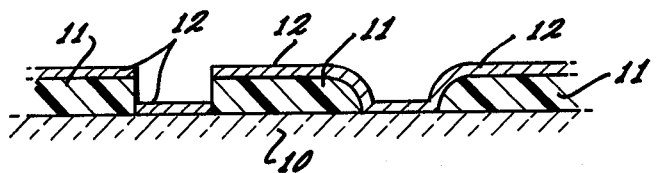
FIG. 2b
FIG. 3
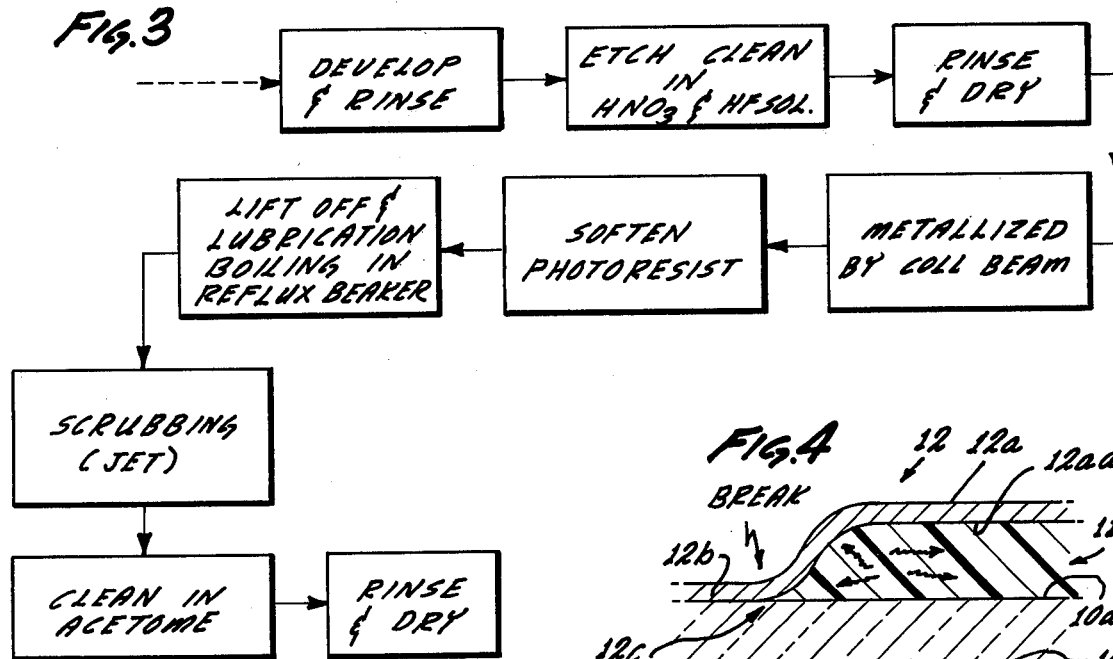
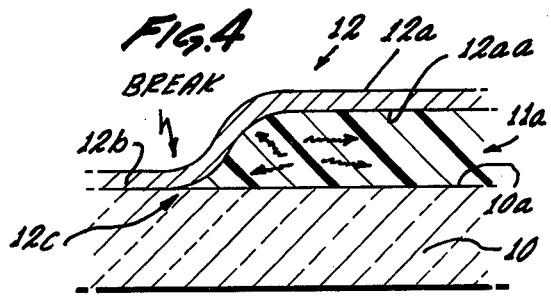
FIG. 4

PHOTOLITHOGRAPHIC METHOD OF MAKING MICROCIRCUITS USING GLYCERINE IN PHOTORESIST STRIPPING SOLUTION

BACKGROUND OF THE INVENTION

The present invention relates to improvements in the method of making microcircuit devices.

The development and growth of microcircuit technology has been directed particularly to devices in which a well-defined pattern of metallization lines, areas and, possibly, islands are provided on a substrate. The substrate may consist of a semi-conductor wafer or of a dielectric wafer consisting e.g., of a piezoelectric crystal. The particular pattern of metallization is usually provided by two major steps. A photographic step generates the pattern on the surface of the substrate as a (developed) photographic image, and a selective metallization step on that surface establishes the final circuit pattern whereby the selectivity is controlled by the photographic pattern image.

One of the methods employed to obtain the objective above is called lift-off photolithography. In accordance with that method the substrate surface is first provided with a photoresist layer; a mask defining the desired pattern is overlaid, and upon exposure by means of suitable radiation the mask is imaged in the photoresist layer. For a positive photoresist, following development and rinsing, certain portions of the photoresist layer which were exposed are removed, whereas the unexposed photoresist remain on and adhere to the substrate. For a negative photoresist, the unexposed portions are removed while the exposed portions remain on the substrate. For the sake of convenience, the use of a positive photoresist shall be presumed, but the situation is readily adaptable to the use of a negative photoresist.

Following the selective removal of photoresist, metal is deposited on the surface which accumulates thereon, basically in two different levels; one level is established by the substrate itself and here particularly by those portions which are now exposed because the photoresist has been removed. The other level is defined by the tops of the unremoved photoresist layer portions. The next step removes the still present, photoresist layer portions together with the metallization thereof; the metal which adhered to the substrate is to remain for establishing the desired pattern of metal lines (electrodes, interelectrode connections, bonding pads, etc.). This removal process may be impeded by too heavily baked-on photoresist material.

It will be appreciated that successful practicing of this method requires that those portions of the metallization which are disposed on photoresist which remained following exposure and rinsing will, in fact, be removed, and those portions of the metallization which adhere to the substrate areas from which the photoresist material was removed, will, in fact, stay. Failure to remove unwanted metallization and/or removal of metallization which is to stay renders the microcircuit defective. Unfortunately, this is quite frequently the case, which means that the production yield of these devices is quite low.

The tendency of the metallization to form a coherent layer is one of the causes for failing to remove unwanted metallization portions. These unwanted portions have to be broken loose as flakes, e.g., by ultrasonics. However, one can readily see that too vigorous a removal process is most likely to cause also some of the desired metallization to be removed from its adhesion to the substrate; insufficient vigor in the removal of unwanted metallization will quite likely fail to accomplish its goal. Details of these problems will be discussed later in this specification with reference to the drawings.

DESCRIPTION OF THE INVENTION

It is an object of the present invention to solve the problem outlined above and to increase the production yield of microcircuitry devices.

It is another object of the present invention to improve the lift-off photolithographic method for generating metallization patterns on substrates, whereby the undesired metallization portions are lifted off, and the desired metalization stays in place with a higher degree of certainty than was heretofore possible.

It is a specific object of the present invention to improve methods for making acoustic, piezoelectric devices.

It is another specific object of the present invention to "rescue" wafers in which the photoresist material was excessively heated for one reason or another which may cause complete failure of the list-off method otherwise.

It is a further object of the present invention to improve a lift-off photolithographic process which includes the steps of applying a photoresist layer to a substrate; imaging photographically a pattern on the photoresist layer; developing the layer and removing portions of that layer; and selectively metallizing the substrate so that metal be attached only to substrate portions from which the photoresist layer has been removed.

In accordance with the preferred embodiment of the invention it is suggested to remove unwanted metallization portions from a substrate and not yet adhering thereto by combining the swelling, dissolution and removal of the developed and metallized photoresist material with a lubricating step by means of which a lubrication is provided of the metallization pieces (flakes) to be removed and lifted as well as of those substrate portions to which the metal portions must not adhere. Specifically, the particular liquid used for swelling and dissolving developed negative or positive photoresist material is supplemented by a lubricant. Thus, lubrication is obtained on the underside of metallization flakes which were supported by developed photoresist layer-material now to be dissolved, as well as of nonmetal substrate surface areas which become exposed upon dissolving the developed photoresist material. In other words, these exposed surfaces are covered with a thin film of lubricant so that the metal flakes to be removed will not attach themselves to substrate material, particularly in areas thereof which should not bear metallization in the final product on account of the desired circuit pattern.

The lifting and lubricating step should concur with fluid agitation to loosen and remove those metallization flakes, which are to be removed. The agitation will include boiling the substrate in the liquid which dissolves the photoresist material and contains the lubricant. Boiling should be succeeded by gently scrubbing the substrate in a jet while being submerged still using the same lubricating and lift-off producing liquid.

In accordance with another feature of the invention, it is suggested to soften the developed metallization carrying photoresist material, using preferably a mixture of a stripper and of a dilutent which enhances diffusion of the stripper through the metal concomitant with the principal step of the invention which impedes attachment of metallization flakes. On the other hand, the attachment of the metallization on the substrate prior to the lifting of the remaining metallization should be enhanced by means of an etching step which precedes immediately the metallization.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 is a flow chart of a prior method of selectively metallizing a lithium niobate substrate;

FIGS. 2a and 2b are cross-sections through such a substrate showing it at two different stages of the process for illustrating problems encountered upon practicing the known method;

FIG. 3 is a flow chart showing how the process as per FIG. 1 should be improved in accordance with the preferred embodiment of the invention; and FIG. 4 shows an enlarged portion of the section view of FIG. 2b for explaining the effect of the invention.

Proceeding now to the detailed description of the drawings, the method to be improved and particularly the problems encountered shall be described first with reference to FIG. 1. Reference is made particularly to the production of a piezoelectric device, such as a surface wave transducer and here, for example, an electroacoustic filter.

A suitable wafer is cut from a crystal ingot, using e.g., lithium niobate, $LiNbO_3$. The wafer is to serve as a substrate for a plurality of microcircuit devices, which are made on the same wafer. Such a wafer is thoroughly cleaned, and a photoresist coating is spun onto the particular surface at a desired thickness of e.g., several thousand Angstroms. A positive photoresist material actually used is, for example, a compound traded under the designation 1350 J or 1350 B by the Shipley Company. The layer is prebaked, the temperature being usually given by the photoresist manufacturer; the particular material stated requires a prebake temperature of about 75° C.

Next, a photographic mask is placed onto the photoresist layer, and the assembly is exposed to light. After removal of the mask, the layer is developed and rinsed. The resulting assembly may have a configuration, a part of which is shown in cross-section in FIG. 2a. Reference numeral 10 denotes the $LiNbO_3$ substrate covered in parts by the developed (hardened) portions 11 of the photoresist coating. It should be mentioned that the dimensions are shown distorted in the vertical as compared with the usual horizontal dimensions of the regions of exposed and rinsed-away photoresist material.

The FIG. 2a includes two cases of which the one to the left can be deemed the ideal case, while the more likely (or more frequently occurring) configuration is seen to the right. The difference results basically from the finite thickness of the photographic mask and the photoresist layer as it may occur. As a consequence, the edges of the developed and remaining photoresist layers are not sharply defined.

Next, in the process the photoresist layer is metallized e.g., by means of a colimated beam of aluminum to obtain a layer 12 which is about 1000 A or a few thousand Angstroms thick. FIG. 2b depicts the result of metallizing the configuration of FIG. 2a by such a collimated metal beam. In the left-hand portion of the device as illustrated the metallized layer on top of the photoresist island is not (or only very insignificantly) connected with the metallization on the substrate portion from which the photographically exposed photoresist has been removed previously. Thus, the metal has been deposited properly in two different levels; one being defined by the photoresist layer surface, the other one by the exposed substrate surface, and there is no or hardly any metal connection present between the several layer portions as deposited in different levels.

The situation is quite different to the right in FIG. 2b. A coherent metallization layering covers photoresist regions or islands as well as the exposed substrate inbetween; the layering may be slightly thinner on the slopes. It will readily be appreciated that these portions joining the metallization in the different levels are the thinner (thicker) the steeper (flatter) the slopes of the regions, substrate or islands are at their edges.

The conventional method now proceeds to lift off the metallization which does not adhere to the substrate, by submerging the device in a suitable chemical, which penetrates and diffuses through the metal layer, dissolves the developed photoresist islands and regions, and carries the metallization thereon along. This method exhibits the following specific defects, failures and deficiencies.

As seen in the right-hand portion on FIG. 2b, wanted and unwanted metallizations are coherent, and the edge portions must be broken. Aside from some indefiniteness as to the specific location of rupture, rupture may not occur at all, and once the photoresist islands which supported an elevated metal layer portion have been removed the metal flake may drop or be flushed against the substrate and adhere. Vigorous attempts to obtain rupture and removal of that flake may in turn loosen the metal on the substrate and remove it, too. Any such flake of metal which once was supported by a photoresist island but now floats in the bath that dissolved the photoresist islands and regions may in some fashion be flushed against the substrate wafer and may attach itself at a completely unforseen and, most likely, quite unwanted location.

It can readily be seen that the problem can be alleviated to some extent by making sure that the edges of the photoresist islands are configured as shown to the left in FIGS. 2a, b. For this, it is adviable to use a flexible mask and to provide for suction prior to exposure so that the mask will be juxtaposed everywhere on the photoresist layer. This procedure makes separation of the wanted from unwanted metallization portions easier, but still does not avoid that lifted off flakes attach themselves to the substrate.

In accordance with the present invention, it is proposed to proceed as follows. The method proceeds along conventional lines and as outlined above with reference to FIG. 1, up to the completion of the photographic phase (exposure, development, rinse) and as indicated by the dotted arrow in FIG. 3. However, prior to metallization the wafer (substrate) carrying developed (hardened) photoresist islands and regions is immersed into a solution which consists of two parts $HNO_3$, one part HF and thirty parts $H_2O$, all parts by volume. The solution will have room temperature and the LiNbO$_3$ wafer should remain in the bath for about ten seconds. I found that the stated concentration and residence period are practical values and constitute optimized conditions from the standpoint of manufacturing. A strong (weaker) solution will require a shorter (longer) period of treatment, but a shorter period has to be maintained more critically in terms of absolute values of time, because any tolerance range in the exposure of the wafer to the etching bath is based on a percentage. The immersion is usually done by hand, so that a shorter period would be more critical and more difficult to maintain. A ten second period for the stated concentration is reasonably safe; if exceeded or cut short by a few seconds very little harm is done. A longer period of immersion at a weaker solution permits greater dipping errors, but is simply impractical from a production standpoint.

The treatment of the wafer by the stated solution introduces a moderately strong etching step in this particular process. It does not affect the photoresist layer (or only insignificantly so). The etching does affect the LiNbO$_3$ material rather mildly and etches away any surface deposits and other impurities, which may have lodged on the substrate and which may not have been removed by the rinsing step of the photoresist process. As a consequence, a fresh surface of stratum of LiNbO$_3$ is exposed.

The wafer is removed from the etching solution and rinsed thoroughly in deionized, i.e., decontaminated water. The rinsing may take about ten seconds, which is an empirically ascertained value. Rinsing for a longer period is not detrimental, but, of course, excessive periods of rinsing may reintroduce accidentally unwanted deposits. Following rinsing, the wafer is dried by a blow drier using an inert gas, e.g., nitrogen. Following the drying the wafer is immediately transferred to the vacuum station in which it is metallized in a conventional manner, i.e., the wafer is subjected to a collimated beam of metal, e.g., aluminum vapor.

As a consequence of the prior etching step, it was found that the metallization will better adhere to the LiNbO$_3$ substrate and its removal will be so much more difficult. Thus, conditions for a successful breakoff of nonadhering metallization portions are improved.

Following the metallization the lift-off part of the process is carried out as follows. Prior to lift-off proper, the developed photoresist regions and islands are softened. The metallized wafer is immersed for about ten seconds into a solution of equal parts (by volume) of methanol and a photoresist stripper. For the particular photoresist mentioned above, it is recommended to use a remover AZ1112, also made by the Shipley Company. The stripper is used to soften the (baked on) photoresist islands. Methanol is actually used to dilute the remover 1112 and to enhance diffusion of the latter through the thin metallization into the photoresist material underneath. Also, the methanol causes rapid swelling of the photoresist as compared with the remover 1112 alone, or acetone.

This softening step is particularly important if the photoresist was overheated during the metallization or was overbaked during the prebake cycle. Conventional lift-off may well fail entirely under these conditions.

After softening of the photoresist, the wafer is immediately transferred to the lifting solution. The transfer must be effected without giving the wafer (and particularly the soaked-through photoresist material) a chance to dry. The particular lifting solution proposed includes a conventional lifting agent to which has been added a lubricant. Specifically, the following solution was found to be particularly effective. Two parts of glycerine and three parts of methanol were added to and mixed with twelve parts of acetone. Acetone is, of course, the principal lifting agent for dissolving and removing developed (hardened) photoresist material; glycerine is the lubricant. The methanol is used here to solve the glycerine in acetone.

The lifting-and-lubricating solution is contained, for example, in a reflux boiler in which the wafers are boiled by boiling the solution while recondensation and return make sure that the concentration of the solution is not altered. This boiling augments the swelling of all the photoresist everywhere on the wafer and obviates the need for mechanical action to cause the metallization to break off after it has been freed from the supporting photoresist. The time for completion here depends to some extent on the pattern of metallization, but it is not believed that boiling in excess of five minutes is needed for even the most intricate circuitry. However, boiling somewhat longer than five minutes may be necessary in some cases; excessive boiling or exposure to this solution has in some cases resulted in stains with aluminum metallizations.

When boiling the wafer in the glycerine-acetone solution the photoresist is dissolved and removed by the bubbling action of swelling and boiling. FIG. 4 shows the agitation in forms of undulated arrows. This swelling, boiling and solving action removes the support material 11 for the portion 12a of the metallization. As soon as any portion of the substrate 10a underneath a photoresist region, such as 11a, becomes exposed to the solution, it is lubricated, i.e., a thin film of lubricant (glycerine) is deposited or at least flow dynamically maintained on the surface portion 10a of the substrate. Also, the metallization surface 12a previously interfacing with a photoresist layer is likewise lubricated. Of course, the top of the metallization 12 is also lubricated right from the beginning as soon as the wafer was immersed in the glycerine-methanol-acetone liquid.

The principal function of the lubrication of, in fact, all exposed surface areas of the wafer and metallization avoids and prevents any metal flake from adhering anywhere except, possibly, very loosely. Thus, upon dissolution of a photoresist island the metallization, such as 12a on top the photoresist 11a, will not collapse and attach itself to the substrate; it may still collapse towards the exposed substrate, surface 10a, but it will slide and be washed away immediately, as the agitation of the liquid due to boiling continues. Also, any metal flake will not attach itself any place else on the wafer 10 except, as stated, only lightly and only temporarily. The boiling introduces sufficient agitation and turbulent flow throughout the liquid so that flake not firmly adhering otherwise, is swept away.

The non-attaching metallization flakes, such as 12a, will readily break off from the metal (portion 12b) that does adhere firmly to the substrate on account of the etching prior to metallization as described above. Thus, there is defined a rather well pronounced discontinuity in the surface property of the substrate, at least for the duration of the process. The regions of firm adherance of metal to the substrate are bounded by lubricated surface portions establishing a rather pronounced discontinuity 12c with regard to attached - not attachable conditions of the surface. In the illustrated example, the conditions for attachment of metal to substrate have been enhanced to the left of this discontinuity 12c by operation of the lubrication. This discontinuity greatly facilitates the defining of the rupture line for the metallization 12a during swelling of the photoresist and boiling.

After the boiling is terminated, most metal flakes are no longer attached to th wafer, but float in the liftoff and lubricating solution. Some flakes may still remain attached to firmly adhering metallization portions, but none of the flakes will collapse towards the substrate and attach itself thereto, because the lubrication and particularly the thin coating of all parts with lubricant, will prevent such attaching. The same, of course, is true in regard to freely floating metal flakes.

After the solution has cooled e.g. to room temperature, a gentle jet of the same solution is directed under the surface of the bath against the wafer surface. In a rather simple fashion, one may retain the wafer (and others) in the main vessel of the reflux boiler, and after cooling one uses a squirt bottle filled with the same kind of liquid which was used during lift-off and lubrication. The nozzel of that bottle is immersed and a jet is produced by squirting; the jet is directed against the wafer surfaces. This operation may well be carried out manually in a properly insulated, decontaminated environment.

It was found that this gentle scrubbing action by the jet completes the lifting and breaks off any still attached flakes. The jet treatment should be carried out while the wafer is still submerged so that the liquid generally can carry the lifted metallization flakes away from the substrate by turbulence. If the jet were applied outside of the bath the flakes would be dragged along the wafer surface any may remain even though attached only very loosely. It is important, that the jet is produced from liquid that still lubricates so that the treatment does not wash away the lubricant at that point.

Next, the wafers are removed individually, and before they dry they should be sprayed gently with acetone. Any flake that still is not removed will now be removed. As this is a short operation additional lubrication is not needed. Moreover, the acetone will now wash away the glycerine film from the wafer and from the metallization.

Finally, the wafer is rinsed in de-ionized water to remove the acetone and any remaining lubricant. The rinsed wafer is dried by blowing with nitrogen. This rinsing and drying step is the same as in the conventional lift-off method. Later, of course, the wafer is cut to separate the individual microcircuits from each other.

It should be mentioned that glycerine was found to be a very effective lubricant, but could be replaced by other known lubricants which are compatible with and made soluble in the lifting liquid, e.g. acetone. The lift-off method with concurring lubrication is quite independent from the type of the substrate used and also from the metal except, of course, that is must not react with either. The solution above is equally usable, for example, in semi-conductor devices, e.g., silicon or silicon dioxide. However, in the case of silicon the etching prior to metallization should be carried out by a one-part-in 20 solution (parts of volume) of HF in water.

The invention is not limited to the embodiments described above but all changes and modifications thereof not constituting departures from the spirit and scope of the invention are intended to be included.

I claim:

1. An improvement in a method for providing a metallization pattern on a substrate, which method includes depositing a photoresist layer on the substrate;
   photographing a pattern on the layer;
   developing the exposed layer and removing portions of the layer to expose the substrate underneath;
   metallizing the remaining portion of the photoresist layer as well as the exposed substrate; and
   dissolving the said remaining portions of the photoresist layer in a photoresist-solving agent, while lifting off the metallization thereon, the improvement comprising the additional step of
   lubricating the metallization as well as any portion of the substrate which becomes exposed upon dissolution of the photoresist material during the lifting step utilizing glycerine added to said photoresist-solving agent, so tht lubricated metallization flakes will be prevented from adhering to the substrate.

2. In a method as in claim 1, wherein the lifting and lubricating step is preceded by a step, following the metallization, of softening the said remaining portions of the photoresist layer and causing them to swell.

3. In a method as in claim 1, and including the step of etching the exposed, nonmetallic substrate surface portion prior to metallization.

4. In a method as in claim 1, said lubricating step being carried out under agitation of said photoresist-solving agent with glycerine added.

5. In a method as in claim 1, wherein said lifting and lubricating steps as combined includes boiling the substrate in said photoresist-solving agent with glycerine added.

6. In a method as in claim 1, wherein the step of lifting includes, scrubbing the surface of the substrate by liquid agitation while submerging the substrate in said photoresist-solving agent with glycerine added.

7. In a method as in claim 6, said scrubbing including directing a submerged liquid jet against the substrate.

8. In a method of making a microcircuit on a non-metallic substrate, which method includes depositing a photoresist layer on the substrate;
   photographing a pattern on the layer;
   developing the exposed layer and removing portions of the layer to expose the nonmetallic substrate underneath;
   further including the following steps,
   etching the exposed substrate surface portions;
   directionally-metallizing the wafer including metallizing the exposed substrate surface as well as the remaining photoresist layer;
   dissolving the remaining photoresist layer portion in a liquid containing glycerine, said glycerine lubricating any surface portion of the metallization and of the substrate previously covered by now dissolving photoresist material;
   agitating the liquid to remove lubricated metallization flakes from the wafer; and
   rinsing and drying the wafer.

9. In a method as in claim 8, said etching being succeeded by rinsing and blow-drying.

10. In a method as in claim 8, said agitating including boiling the wafer in said liquid containing glycerine.

11. In a method as in claim 8, said agitating including, directing a jet of said liquid-containing glycerine against the wafer.

12. In a method as in claim 8, wherein the dissolving step is preceded by a softening step for the photoresist material.

13. In a method as in claim 12, said softening step being carried out by a photoresist stripper.

14. In a method as in claim 13, using a stripper solved in a medium to enhance diffusion through the metallization.

15. In a method as in claim 8, said liquid comprising a mixture of glycerine, methanol and acetone reapectively at a parts by volume ratio of about 2 : 3 : 12.

16. In a method as in claim 15, wherein the dissolving step is preceded by a softening step for the photoresist material.

17. In a method of selectively metallizing a substrate on which portions of the substrate have been directly metallized, while other portions of the substrate are provided with photoresist the top of which has also been metallized, comprising:
dissolving said photoresist in a liquid under gentle agitation while concurrently lubricating any of the metallization and the substrate exposed upon the dissolving of the said photoresist utilizing glycerine added to said liquid.

18. In a method as in claim 17, wherein the dissolving step is preceded by a softening step for said photoresist.

19. In a method as in claim 17, wherein the dissolving and lubricating step is carried out by boiling the substrate in said liquid which includes a solvent for said photoresist and said glycerine.

20. In a method as in claim 18, wherein the boiling is succeeded by jet scrubbing the substrate by the said liquid.

21. In a method of providing a particular metallization pattern on a substrate;
providing a photoresist layer on the substrate in a pattern related to the particular metallized pattern;
metallizing the substrate at least in the portion of the substrate where the photoresist layer has not been provided on the substrate; and
removing the photoresist layer from the substrate by dissolving the photoresist layer in a photoresist-solving solution and simultaneously lubricating with glycerine added to said solution any metallized portions of the photoresist layer as the layer is being dissolved.

22. The method set forth in claim 21, wherein the step of removing the photoresist layer from the substrate is preceded by the step of softening and swelling the photoresist layer followed by the step of lifting and dissolving the photoresist layer from the substrate.

23. The method as set forth in claim 21 wherein said solution comprises glycerine, methanol and acetone.

24. The method as set forth in claim 23, wherein the solution of glycerin, methanol and acetone constitutes approximately two parts by volume of glycerine, three parts by volume of methanol and twelve parts by volume of acetone.

25. An improvement in a method for providing a metallization pattern on a substrate, which method includes depositing a photoresist layer on the substrate;
photographing a pattern on the layer;
developing the exposed layer and removing portions of the layer to expose the substrate underneath;
metallizing the remaining portion of the photoresist layer as well as the exposed substrate; and
dissolving the said remaining portions of the photoresist layer in a photoresist-solving agent, while lifting off the metallization thereon, the improvement comprising the additional step of
lubricating the metallization as well as any portion of the substrate which becomes exposed upon dissolution of the photoresist material during the lifting step utilizing glycerine added to said photoresist-solving agent, so that lubricated metallization flakes will be prevented from adhering to the substrate, said photoresist-solving agent with glycerine added comprising a mixture of glycerine, methanol, and acetone at a parts by volume ratio of about 2 : 3 : 12, respectively.

* * * * *